(12) United States Patent
Jones

(10) Patent No.: US 6,778,409 B2
(45) Date of Patent: Aug. 17, 2004

(54) COMPONENT ACCESS

(75) Inventor: Rhod Jones, Crowthorne (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/354,422

(22) Filed: Jan. 30, 2003

(65) Prior Publication Data

US 2003/0161131 A1 Aug. 28, 2003

(30) Foreign Application Priority Data

Feb. 28, 2002 (GB) .............................................. 0204775

(51) Int. Cl.[7] ................................................ H05K 7/14
(52) U.S. Cl. ........................ 361/796; 361/730; 361/752; 361/683; 174/50; 174/52.1
(58) Field of Search ................................ 361/796, 730, 361/788, 752, 685, 684, 683, 797; 174/50, 52.1; 211/41.17

(56) References Cited

U.S. PATENT DOCUMENTS

| | | | |
|---|---|---|---|
| 4,717,216 A | | 1/1988 | Hornak |
| 5,460,441 A | | 10/1995 | Hastings et al. |
| 5,740,378 A | | 4/1998 | Rehl et al. |
| 5,790,374 A | * | 8/1998 | Wong .......................... 361/685 |
| 5,822,184 A | * | 10/1998 | Rabinovitz .................. 361/685 |
| 6,061,250 A | | 5/2000 | Lavan |
| 6,134,615 A | | 10/2000 | Chari et al. |
| 6,153,947 A | | 11/2000 | Rockow et al. |
| 6,219,229 B1 | * | 4/2001 | Lee ............................. 361/683 |
| 6,247,080 B1 | | 6/2001 | Wallach et al. |
| 6,324,608 B1 | | 11/2001 | Pap et al. |
| 6,418,492 B1 | | 7/2002 | Papa et al. |
| 6,525,926 B1 | * | 2/2003 | Chen .......................... 361/683 |
| 6,532,545 B1 | | 3/2003 | Klein |
| 6,658,019 B1 | * | 12/2003 | Chen et al. ................. 370/465 |

FOREIGN PATENT DOCUMENTS

| | | |
|---|---|---|
| EP | 349 285 | 1/1990 |
| GB | 2 187 334 | 9/1987 |
| GB | 2 235 592 | 11/1988 |

OTHER PUBLICATIONS

Search Report under Section for Application No. GB 0204775.1, Oct. 4, 2002, 1 page.
Search Report under Section for Application No. GB 0204775.1, Oct. 4, 2002, 1 page.

* cited by examiner

Primary Examiner—Randy W. Gibson
Assistant Examiner—Dameon E. Levi
(74) Attorney, Agent, or Firm—Meyertons Hood Kivlin Kowert & Goetzel, P.C.; B. Noël Kivlin

(57) ABSTRACT

A circuit module for a rack-mounted circuit has a motherboard detachably mounted in the module for removal and replacement while the module remains in the rack.

14 Claims, 3 Drawing Sheets

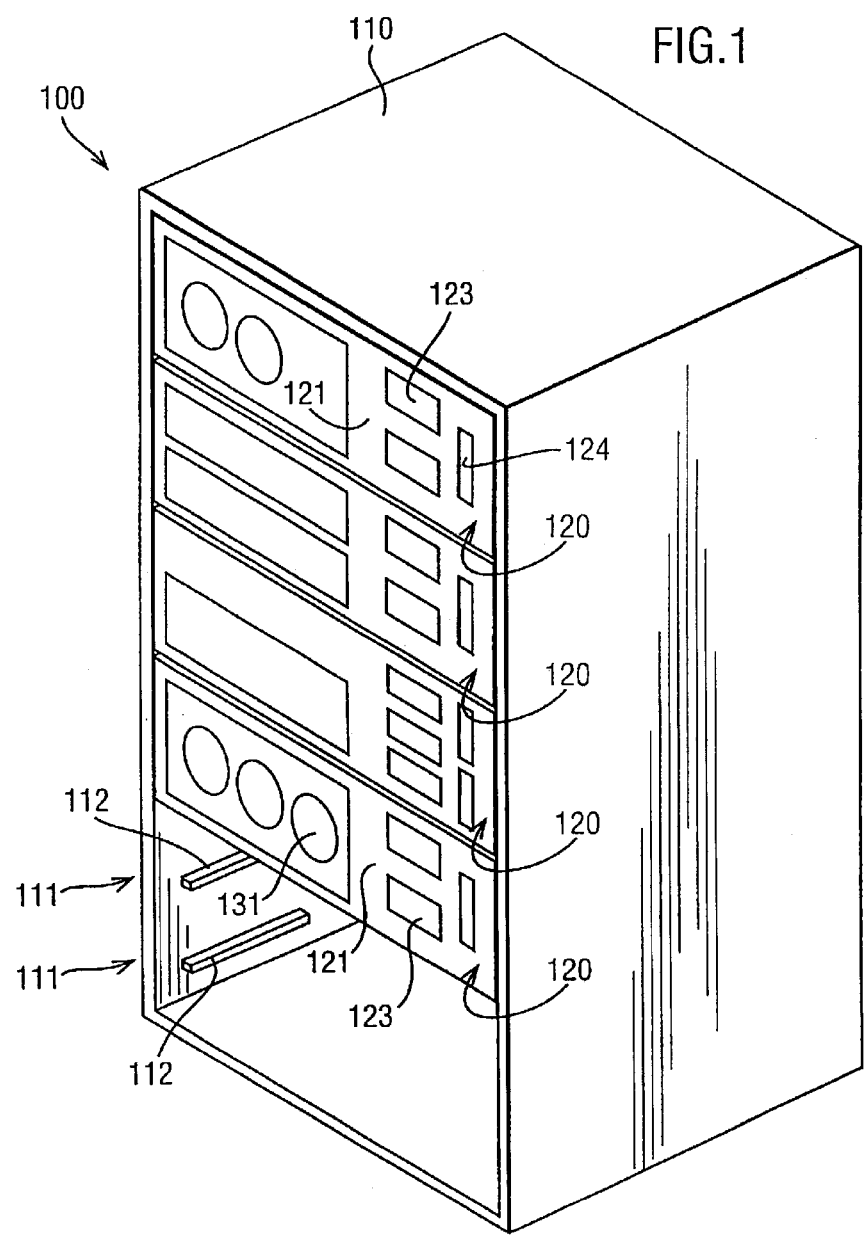

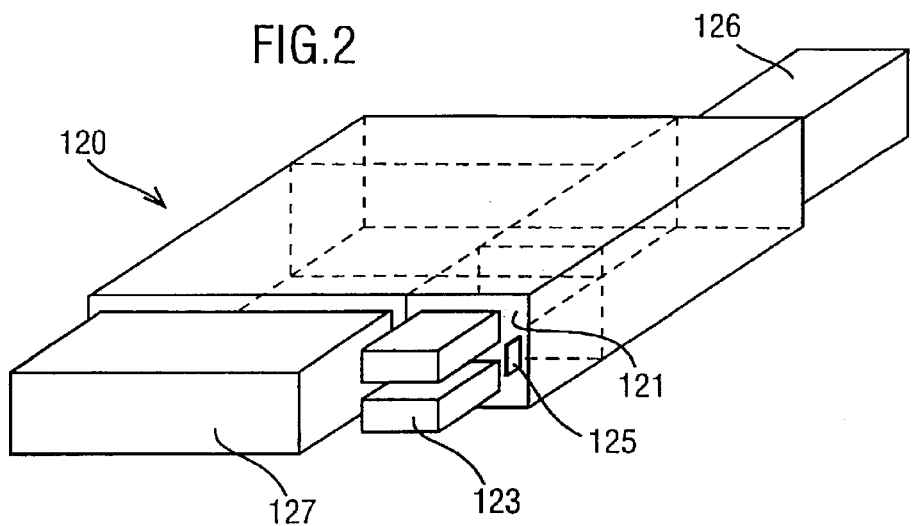
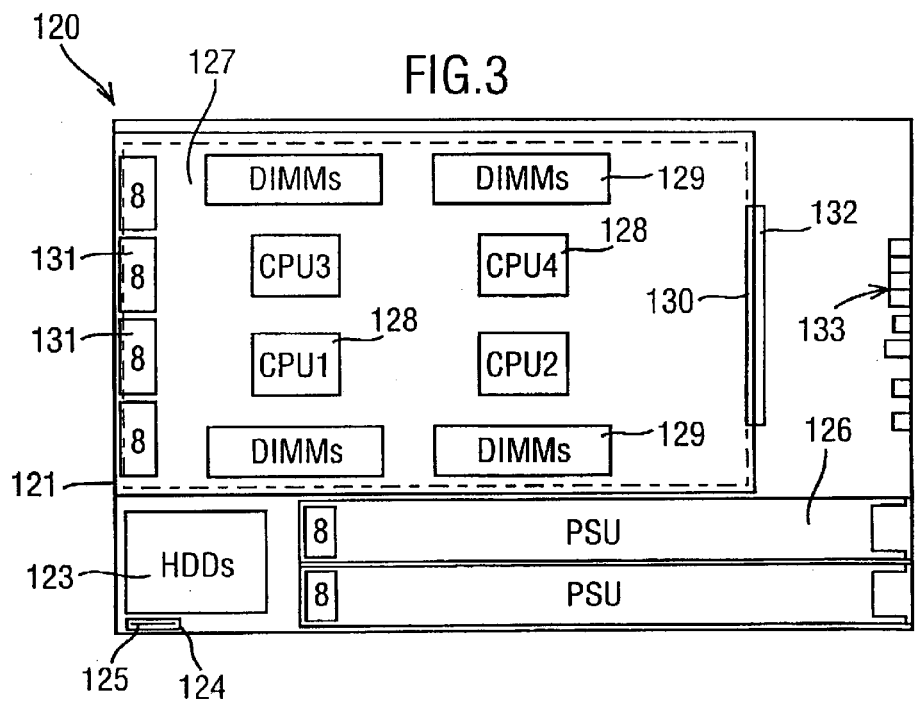

COMPONENT ACCESS

BACKGROUND OF THE INVENTION

The present invention is concerned with rack-mounted computing systems, and particularly concerns systems comprising a supporting structure such as a rack and a number of circuit modules, each of the circuit modules having a memory and/or a processing circuit or "motherboard" and a number of ancillary elements such as disc drives, smart cards drive, power supply units, and the like.

Modular systems have been developed to facilitate the assembly of complex and powerful computing systems from standardised component modules, wherein each module has a "motherboard" providing processing and memory capability, and ancillary elements to provide power to, and to communicate data to and from, the processor or memory. Servicing of the modules has hitherto involved partial or complete removal of the module from the rack, which increases servicing time. To reduce servicing time, ancillary elements such as disc drives have been configured so as to be removable from the module without removing the module from the rack.

Removable ancillary elements enable the rapid repair and upgrading of a fault in the computing system, by simply removing the faulty or inadequate elements and replacing them with serviceable or enhanced ones. This operation may even be done while the remainder of the system continues to function, in an operation known as "hot swapping".

The system board or motherboard has always been considered an integral part of a module, and any servicing of the motherboard (comprising the I/O memory or processing circuit), necessitates removal of the module from the rack.

The present invention seeks to provide a rack-mountable module for a modular electronic circuit wherein servicing of all parts of the module can be effected without removing the module from the rack. One embodiment of the invention provides a circuit module wherein the motherboard is detachably mountable within the module. In an alternative embodiment peripheral and ancillary components and elements are detachably mountable to the module.

SUMMARY OF THE INVENTION

Embodiments of the present invention provide a module for a modular computing circuit which enables replacement of a faulty motherboard without the need to remove an entire module from the computing circuit, a computing circuit incorporating such a module, and a computer repair procedure.

According to one aspect of the present invention, there is provided a modular electronic circuit formed by a plurality of circuit modules mounted to a supporting rack and electrically interconnected, each module comprising a main processing or memory circuit and at least one ancillary device, wherein the main processing or memory circuit is mounted to the module so as to be removable when the module is in the rack. The ancillary devices, such as data drives, cooling units, or power supply units may also be detachably mounted to the module. Embodiments are foreseen wherein all active components of the circuit are detachably mounted in the module for selective replacement or upgrading. When all removable components have been removed from such a module, only the housing having the mechanical fixings and electrical interfaces remains. The housing, which contains no active components, exhibits high reliability and is intended never to need removal from the rack.

According to a second aspect of the present invention, there is provided a circuit module comprising a housing mountable to a supporting structure, receiving elements for releaseably receiving a main processing or memory circuit within the housing, and an ancillary device such as a power supply unit mounted within the housing. The module may further comprise cooling fans and/or data drives.

According to a third aspect of the present invention, there is provided a method for rectifying a fault in a processing circuit of a module by replacing a processing or memory circuit of a circuit module wherein the processing or memory circuit is detachably mounted to the module while the module is mounted to a rack, the method involving removing the processing or memory circuit while leaving the remainder of the module in the rack, and mounting a serviceable processing or memory circuit in place of the faulty circuit.

BRIEF DESCRIPTION OF THE DRAWINGS

Embodiments of the invention will now be described in detail with reference to the accompanying drawings, in which like reference numerals designate corresponding elements. In the drawings:

FIG. 1 is a schematic perspective view of a modular circuit assembly comprising a plurality of circuit modules mounted in a supporting rack;

FIG. 2 is a schematic perspective view of a circuit module, showing removable parts;

FIG. 3 is a sectional plan view of the circuit module of FIG. 2;

DESCRIPTION OF PARTICULAR EMBODIMENTS

Figure 4:
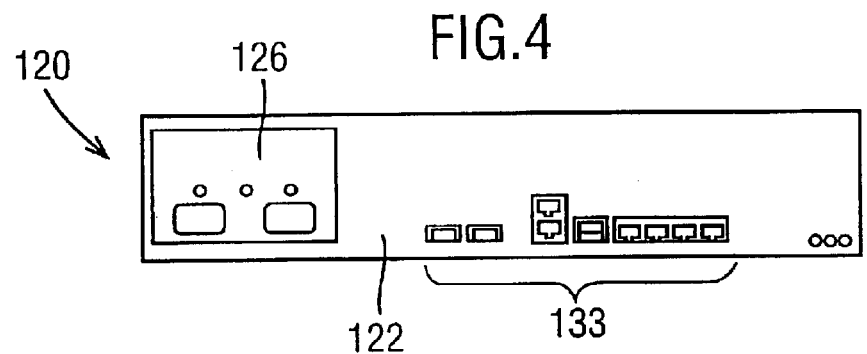
FIG. 4 is a rear view of the circuit module of FIG. 2.

FIG. 1 shows a modular circuit assembly 100 of a first embodiment of the present invention. The circuit assembly 100 comprises a supporting structure or rack 110, to which circuit modules 120 are removably mounted in a columnar array. Four circuit modules are shown, but it is to be understood that the circuit assembly may comprise fewer or more circuit modules. in the rack shown, two empty slots 111 with mounting rails 112 to receive further modules 120 are seen at the lower part of the rack 110.

Each of the modules 120 comprises a housing having a front face 121 and a rear face 122 (seen in FIG. 4). On the front of the module, accessible via the front face 121, are mounted one or more disc drives 123, and optionally also a smart card port 124 to accept a data card 125 or the like. The drives 123 and port 124 are mounted to the front face of the module 120 so as to be accessible when the module is in operation, for the insertion and exchange of data discs and/or cards used to configure the functionality of the module 120.

The module 120 also includes power supply elements 126 (seen in FIG. 4) which provide power at the appropriate voltages to the various circuits and drive units in the module 120.

The main processing circuitry of the module 120 is contained in a "motherboard" sub-assembly 127. In the embodiment shown in FIGS. 1 to 4, the motherboard sub-assembly 127 comprises a housing receivable within the module 120, the front face of the motherboard sub-assembly 127 being substantially flush with the front face of the module 120 when the motherboard sub-assembly 127 is mounted thereto.

Referring particularly to FIG. 3, the motherboard sub-assembly 127 comprises a circuit board on which are mounted processing units 128 and memory units 129, connected by wiring to each other and to a connection socket 130 at the rear of the sub-assembly 127. The front face of the sub-assembly 127 is provided with an array of ventilators such as axial flow cooling fans 131, which draw cooling air from outside the sub-assembly 127. The rear of the sub-assembly 127 is provided with air outlet openings, so that the fans 131 establish an air flow across the processing units 128 and memory units 129 to cool them in operation. Heated air exiting from the sub-assembly 127 into the interior of the module 120 may escape either through ventilation openings in the rear face of the module 120, or may be extracted by extractor fans mounted in the front or rear face of the module 120 at convenient locations.

The module 120 comprises internal guides to bring the motherboard sub-assembly 127 to a predetermined position within the module 120, so that the connection block 130 of the motherboard sub-assembly 127 may correctly cooperate with a mating connection block 132, which may be for example an edge connector, mounted within the module 120 when the sub-assembly 127 is fully inserted into the module 120. The connection block 132 of the module 120 is electrically connected to the disc drives 123, card drive 124, power supply units 126 and to an array of connection sockets 133 in the rear wall of the module 120. Electrical connections between modules 120 are made by plugging connecting leads into the array of connection sockets 133 in the rear faces of the modules 120.

In operation, the electronic circuit of the circuit assembly 100 may operate to perform computing functions, using the processing units 128 and memory units 129 of the respective modules 120 in the circuit assembly 100. When a processing unit 128 or a memory unit 129 of one of the modules 120 develops a fault, monitoring software may detect the fault, and an indication of a faulty unit may be provided, for example by means of one or more indicator lights on the front face of the motherboard sub-assembly 127. Hitherto, such a fault would have necessitated the removal of the entire module 120, depriving the remainder of the computing circuit of any data or programming information contained in removable discs in the drives 124 and 123. In the circuit embodying the present invention, however, when a fault is detected in the processing or memory units of a motherboard, the motherboard sub-assembly 127 of the affected module may simply be removed and replaced by a serviceable unit. Any programming information or data contained on media within the drives 123 and 124 is still accessible to the processing units of the other modules 120 while the sub-assembly 127 is removed, maintaining the maximum possible functionality of the circuit as a whole during the replacement of the faulty motherboard.

In the embodiments shown, the motherboard sub-assembly 127 which shows a fault indication is simply removed by drawing it forward out of the module 120, thus breaking the connection between connection blocks 130 and 132. A serviceable unit is replaced by using the reverse procedure, culminating in the mating of the connection block 130 of the new sub-assembly with the connection block 132 of the module 120. Releaseable latching elements may be provided on the module 120 and the motherboard sub-assembly 127 to retain the sub-assembly 127 in its mounted position. The position of the latching elements may be detected, for example by microswitches, and the microswitches may be connected in series to the electrical connections to the sub-assembly so that, for example, unlatching of the latching elements causes interruption of the power supply to the sub-assembly. The latching elements may include a key lock to prevent unauthorised removal, and cam elements to ensure firm electrical contact between the connection blocks 130 and 132.

Figure 5:
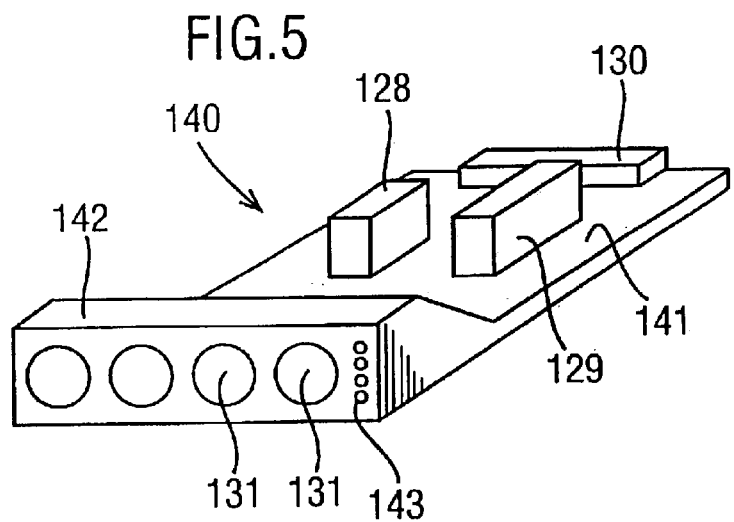
FIG. 5 is a perspective view of an alternative embodiment of the motherboard sub-assembly.

In the embodiment shown in FIGS. 1 to 4, the motherboard sub-assembly is contained in a substantially closed housing receivable within the module 120. FIG. 5 shows an alternative motherboard sub-assembly 140, configured as a substantially planar tray 141 having an upstand 142 at the front edge of the tray. The upstand 142 provides support for a number of cooling fans 131 and may also support a number of fault-indicating lights 143. The fault indicating lights may comprise a green light to indicate "no fault, power on" and a yellow light to indicate a faulty sub-assembly. As an alternative to mounting the indicator lights on the sub-assembly, they may be mounted on the front face of the module 120. Processing and memory units 128 and 129 are mounted to the tray 141, and a connection block 130 is positioned at the rear edge of the tray 141, to mate with a corresponding connection block 132 of the circuit module 120. In the motherboard sub-assembly of FIG. 5, a single processing unit 128 and a single memory unit 129 are shown. It will be understood that the processing circuitry of the motherboard sub-assembly 140 may comprise a plurality of processing and/or memory units. The tray 141 may comprise a supporting structure and a circuit board mounted thereto, or may simply comprise a circuit board having wiring tracks for electrically connecting the components mounted to the tray with the connection block 130, and for supplying power to the fans 131.

The module 120 may comprise internal partitioning positioned to extend along the side edges of the tray 141 when the tray 141 is in the operating position, to channel air delivered by the cooling fans 131 over the processing electronics mounted on the tray 141.

As an alternative to the cooling fans 131, the motherboard sub-assembly 127 may simply comprise openings in its front face covered by filter meshes, and an air flow may be induced through these openings to provide cooling air to the processing electronics by means of extractor fans removably mounted to the rear face of the module 120. By mounting the cooling fans in the front faces of the motherboard sub-assemblies, however, rapid exchange of faulty fan units may be effected by removing and replacing them without removing the motherboard sub-assembly 127 from the module 120 and without requiring access to the rear face of the circuit assembly 100.

The scope of the present disclosure includes any novel feature or combination of features disclosed herein either explicitly or implicitly or any generalisation thereof irrespective of whether or not it relates to the claimed invention or mitigates any or all of the problems addressed by the present invention. The applicant hereby gives notice that new claims may be formulated to such features during the prosecution of this application or of any further application derived herefrom. In particular, with reference to the appended claims, features from dependent claims may be combined with those of the independent claims and features from respective independent claims may be combined in any appropriate manner and not merely in the specific combinations enumerated in the claims.

What is claimed is:

1. A modular electronic circuit assembly comprising a supporting rack structure and a plurality of circuit modules removably mounted thereto and coupled together, wherein at least a first one of said circuit modules comprises a rack-mountable housing, a first motherboard sub-assembly, and at least a first ancillary unit mounted to said rack-mountable housing, wherein the first motherboard sub-assembly is detachably mounted to the rack-mountable housing;

wherein the first motherboard sub-assembly and the first ancillary unit are coupled together and are further coupled to a second motherboard sub-assembly and a second ancillary unit of a second circuit module;

wherein the first ancillary unit remains coupled to the second motherboard sub-assembly and the second ancillary unit when the first motherboard sub-assembly is removed from the first circuit module.

2. The modular electronic circuit assembly according to claim 1, wherein the rack-mountable housing of said first circuit module has an accessible front face and the first motherboard circuit motherboard sub-assembly is removable through an opening in the front face of the housing.

3. The modular electronic circuit assembly according to claim 1, wherein the first ancillary unit is disposed in the rack-mountable housing outside the first motherboard sub-assembly.

4. The modular electronic circuit assembly according to claim 1, wherein the first ancillary unit is a disc drive unit.

5. A housing for an electronic circuit module, comprising:

an enclosure having a front face;

an opening in the front face to admit a first motherboard sub-assembly into the enclosure;

a first connection element for electrically connecting to the first motherboard sub-assembly mounted to the enclosure; and at least a first ancillary unit within the enclosure and electrically connected to the connection element;

wherein the first motherboard sub-assembly and the first ancillary unit are coupled to a second motherboard sub-assembly and a second ancillary unit of a second circuit module via the first connection element;

wherein the first ancillary unit remains coupled to the second motherboard sub-assembly and the second ancillary unit when the first motherboard sub-assembly is removed from the first circuit module.

6. The housing according to claim 5, further comprising guide elements for guiding the first motherboard sub-assembly to and from a mounted position relative to the enclosure.

7. The housing according to claim 6, further comprising releaseable latching elements cooperable with said first motherboard sub-assembly to retain the sub-assembly in the mounted position.

8. The housing according to claim 7, wherein a switching device is operable by release of the latching elements to electrically disconnect said first motherboard sub-assembly from said first connection element.

9. The housing according to claim 5, wherein the first ancillary unit is a power supply unit.

10. The housing according to claim 5, wherein the first motherboard sub-assembly comprises:

a circuit board and a plurality of circuit components;

an electrical connection element at one edge of the circuit board; and an upstand formed at an edge of the circuit board opposite to the connection element, the upstand substantially corresponding in dimensions to the opening in the front face of the enclosure.

11. The housing according to claim 10, wherein the upstand comprises a ventilation opening.

12. The housing according to claim 11, wherein a ventilator is mounted to move air through the ventilation opening.

13. The method of rectifying a fault in a modular electronic circuit assembly including a first circuit module comprising:

a rack-mountable housing;

a first motherboard sub-assembly, and at least a first ancillary device mounted to the housing;

wherein the first motherboard sub-assembly and the first ancillary unit are coupled together and are further coupled to a second motherboard sub-assembly and a second ancillary unit of a second circuit module;

wherein the first motherboard sub-assembly is detachably mounted to the housing, the method comprising:

demounting and removing the first motherboard sub-assembly from the first circuit module; and mounting a serviceable motherboard sub-assembly to the first circuit module;

wherein the demounting and mounting steps are effected while the first ancillary unit of the first circuit module remains coupled to the second motherboard sub-assembly and the second ancillary unit of the second circuit module.

14. The method according to claim 13, wherein:

the demounting step comprises demounting and removing the first motherboard sub-assembly from the housing; and the mounting step comprises mounting a serviceable motherboard sub-assembly to the housing.

* * * * *